(12) United States Patent
Cortese et al.

(10) Patent No.: US 8,043,881 B2
(45) Date of Patent: Oct. 25, 2011

(54) ELECTRONIC DEVICE INCLUDING MEMS DEVICES AND HOLED SUBSTRATES, IN PARTICULAR OF THE LGA OR BGA TYPE

(75) Inventors: Mario Cortese, Milan (IT); Mark Anthony Azzopardi, Gudja (MT); Edward Myers, Marsaxlokk (MT); Chantal Combi, Oggiono (IT); Lorenzo Baldo, Bareggio (IT)

(73) Assignees: STMicroelectronics S.r.l., Agrate Brianza (IT); STMicroelectronics (Malta) Ltd., Kirkop (MT)

( * ) Notice: Subject to any disclaimer, the term of this patent is extended or adjusted under 35 U.S.C. 154(b) by 0 days.

(21) Appl. No.: 12/969,022

(22) Filed: Dec. 15, 2010

(65) Prior Publication Data
US 2011/0081739 A1    Apr. 7, 2011

Related U.S. Application Data

(62) Division of application No. 12/006,819, filed on Jan. 4, 2008, now Pat. No. 7,875,942.

(30) Foreign Application Priority Data

Jan. 4, 2007   (IT) ............................. MI2007A0007
Jan. 4, 2007   (IT) ............................. MI2007A0008

(51) Int. Cl.
*H01L 29/84* (2006.01)
(52) U.S. Cl. .......... 438/51; 438/125; 257/415; 257/698; 257/E23.19; 257/E29.324; 257/E21.5

(58) Field of Classification Search .................. 257/415, 257/698, E23.19, E21.5, E29.324; 438/51, 438/125
See application file for complete search history.

(56) References Cited

U.S. PATENT DOCUMENTS

| | | |
|---|---|---|
| 6,624,003 B1 | 9/2003 | Rice |
| 2001/0007733 A1 | 7/2001 | Matsuyama et al. |
| 2002/0054422 A1 | 5/2002 | Carr et al. |
| 2003/0059976 A1 | 3/2003 | Nathan et al. |
| 2005/0120553 A1 | 6/2005 | Brown et al. |
| 2005/0263841 A1 | 12/2005 | Fincato |
| 2006/0086899 A1 | 4/2006 | Chao et al. |
| 2006/0128058 A1 | 6/2006 | Dungan et al. |
| 2006/0148137 A1* | 7/2006 | Hartzell et al. ............... 438/149 |
| 2008/0164543 A1 | 7/2008 | Ziglioli et al. |
| 2008/0179697 A1 | 7/2008 | Cortese et al. |

FOREIGN PATENT DOCUMENTS

| | | |
|---|---|---|
| EP | 1775259 | 10/2005 |
| EP | 1945561 | 7/2008 |

* cited by examiner

*Primary Examiner* — Jami M Valentine
(74) *Attorney, Agent, or Firm* — Lisa K. Jorgenson; Kevin D. Jablonski; Graybeal Jackson LLP

(57) ABSTRACT

An electronic device includes a substrate provided with a passing opening and a MEMS device including an active surface wherein a portion of the MEMS device is integrated sensitive to chemical/physical variations of a fluid. The active surface of the MEMS device faces the substrate and is spaced therefrom, the sensitive portion being aligned to the opening. A protective package incorporates at least partially the MEMS device and the substrate, leaving at least the sensitive portion of the MEMS device, and the opening of the substrate exposed. A barrier element is positioned in an area which surrounds the sensitive portion to realize a protection structure for the MEMS device, so that the sensitive portion is free.

21 Claims, 10 Drawing Sheets

ELECTRONIC DEVICE INCLUDING MEMS DEVICES AND HOLED SUBSTRATES, IN PARTICULAR OF THE LGA OR BGA TYPE

PRIORITY CLAIM

The present application is a divisional of U.S. patent application Ser. No. 12/006,819, filed Jan. 4, 2008, which application claims priority from Italian patent application No. MI2007A 000008, filed Jan. 4, 2007, and Italian patent application No. MI2007A 000007, filed Jan. 4, 2007; all the foregoing applications are incorporated herein by reference in their entireties.

TECHNICAL FIELD

Embodiments of the present disclosure relate generally to an electronic device including MEMS devices and holed substrates, in particular of the LGA or BGA type.

More specifically, embodiments of the present disclosure relate particularly, but not exclusively, to an electronic device including MEMS sensors mounted on an LGA substrate, wherein the MEMS sensor needs a physical interface of communication with the outer environment of the electronic device and the following description is made with reference to this field of application for convenience of illustration only.

BACKGROUND

As it is well known, a MEMS device (micro-electro-mechanical system) is a micro device which integrated the mechanical and electrical functions in a silicon chip or die realized by using the lithographic techniques of micro manufacturing. The final assembled device is typically made of the silicon die wherein the MEMS is integrated and, optionally, of integrated circuits for specific applications mounted on a substrate, for example, of the LGA or BGA type (Land Grid Array or Ball Grid Array), flanked or piled onto the MEMS device, using the conventional assembling processes.

A cover or cap fixed to the substrate, encapsulates the MEMS device and the other integrated circuits mounted on the substrate, forming the package for protecting it from external physical stresses.

If the MEMS device is a pressure, gas or liquid sensor or a microphone, the cover is provided with holes for allowing the interaction between the device and outside of the assembled device.

It is also known that the substrate of the LGA/BGA type is formed by conductive layers insulated from each other by means of layers of insulating or dielectric material. The conductive layers are shaped in conductive tracks insulated from each other by layers of insulating or dielectric material. Conductive holes, called "vias", are typically realized through the insulating layers with a vertical orientation with respect to the layers, to form conductive paths between conductive tracks belonging to different conductive layers.

The MEMS devices are then electrically coupled to the outside of the final device, through wires which connect contact lands provided on the MEMS devices with the conductive tracks present on the substrate inside the cover.

Although advantageous under several aspects, these types of assembled electronic devices including MEMS sensors require, between the cap/cover and the substrate, a welding ring.

Moreover, the formation of this cover/cap which completes the assembled electronic device provides a series of process steps which are not provided in the realization of integrated circuits, with a considerable cost increase.

There is a need for electronic devices including MEMS devices and having such structural characteristics as to allow this electronic device to be made with manufacturing processes of conventional integrated circuits, overcoming the limits and/or the drawbacks still limiting the electronic devices realized according to the prior art.

SUMMARY

Embodiments of the present disclosure are directed to an electronic device including a MEMS device wherein the protective package is realized by means of molding.

According to one embodiment, an electronic device includes a substrate provided with a passing opening and a MEMS device including an active surface wherein a portion of the MEMS device is integrated sensitive to chemical/physical variations of a fluid. The active surface of the MEMS device faces the substrate and is spaced therefrom, the sensitive portion being aligned to the opening. A protective package, which incorporates at least partially the MEMS device and the substrate, leaves at least the sensitive portion of the MEMS device and the opening of the substrate exposed. A barrier element is positioned in an area which surrounds the sensitive portion for realizing a protection structure for the MEMS device, so that the sensitive portion is free.

The characteristics and the advantages of electronic devices and methods of forming such devices according to the present disclosure will be apparent from the following description of embodiments thereof given by way of indicative and non limiting example with reference to the annexed drawings.

BRIEF DESCRIPTION OF THE DRAWINGS

In these figures:

FIG. 3b is a plan view which shows an active surface of the MEMS devices of FIG. 3a.

DETAILED DESCRIPTION

The following discussion is presented to enable a person skilled in the art to make and use the subject matter disclosed herein. Various modifications to the embodiments will be readily apparent to those skilled in the art, and the generic principles herein may be applied to other embodiments and applications without departing from the spirit and scope of the present subject matter. Thus, the present disclosure is not intended to be limited to the embodiments shown, but is to be accorded the widest scope consistent with the principles and features disclosed herein.

Figure 1:
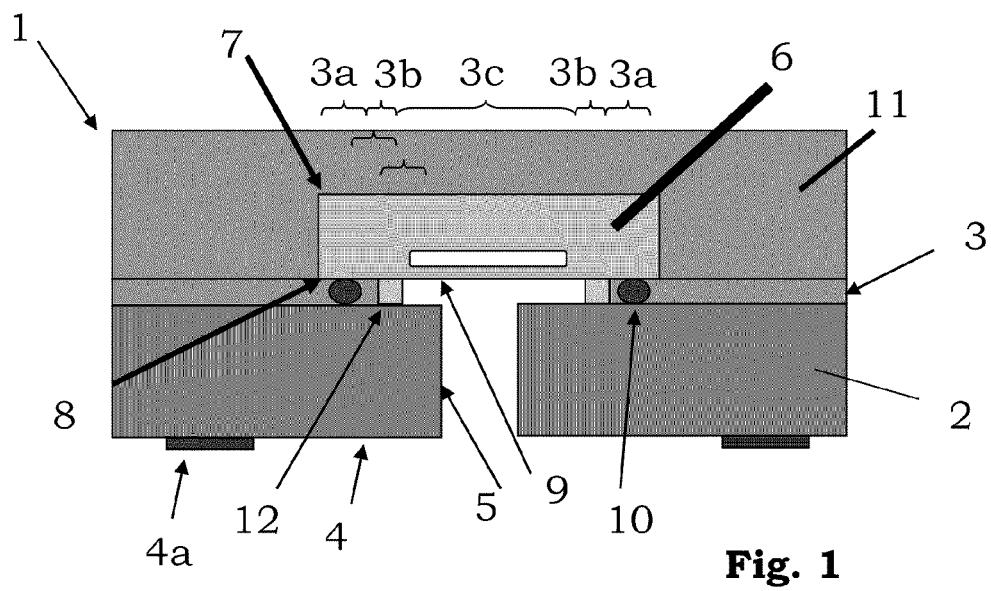
FIG. 1 is a sectional view of an electronic device including MEMS devices according to a first embodiment.

With reference to FIG. 1, an electronic device 1 is shown for MEMS devices according to a first embodiment which includes a substrate 2, for example of the LGA/BGA type, having an upper surface 3 and a lower surface 4 opposed to the upper surface 3, provided with an opening 5 passing between these surfaces 3, 4 and including conductive tracks, at least partially interconnected with each other, formed on these surfaces 3, 4. Moreover, lands 4a coupled to conductive tracks present on the lower surface 4 are present on this lower portion 4. A MEMS device 6 including a die, for example of silicon, having a non active surface 7 and an active surface 8 opposed to the non active surface 7. Advantageously, in the silicon die, in correspondence with the active surface 8, a sensitive portion 9 of MEMS device 6 is integrated. In particular, the MEMS device 6 is a sensor wherein the portion 9 is sensitive to chemical and/or physical variations of a fluid present outside the electronic device 1, and the fluid interacts with the sensitive portion 9 of the MEMS device 6, through the opening 5.

According to this embodiment the active surface 8 of the MEMS device 6 faces the upper surface 3 of the substrate 2 and is spaced therefrom and the sensitive portion 9 is aligned to the opening 5.

Moreover, the peripheral portion of the active surface 8 of the MEMS device 6 is provided with connection lands for the electric connection to conductive tracks present on the upper surface 3 of the substrate 2, by means of electric connections 10, for example bumps.

Advantageously, the MEMS device 6 is electrically mounted on the substrate 2 by means of known "flip-chip" assembly methods.

In particular, between the active surface 8 of the MEMS device 6 and the upper surface 3 of the substrate 2 different functional areas remain defined: a free central area 3c aligned to the sensitive portion 9, a lateral area 3a which surrounds the free central area 3c wherein electric connections 10 are present which electrically couple the MEMS device 6 with the substrate 2, and a mean area 3b included between the lateral area 3a and the free central area 3c. In particular also the mean area 3b surrounds the sensitive portion 9 of the MEMS device 6.

Also according to embodiments, the electronic device 1 includes a protective package 11, realized through molding, which incorporates the MEMS device 6, the electric connections 10 and the substrate 2, leaving the sensitive portion 9 of the MEMS device 6 and the lower surface 4 and the opening 5 of the substrate 2 exposed.

In other words, the MEMS device 6 is enclosed in the protective package 11.

According to embodiments, a barrier element 12 is positioned in an area 3b which surrounds the sensitive portion 9, i.e., it is realized in correspondence with the mean area 3b.

Advantageously according to embodiments, the presence of this barrier element 12 protects the sensitive portion 9 during the manufacturing step of the protective package 11, through molding, so that this sensitive portion 9 remains free.

In particular, in a known way, the formation of the protective package 11 provides the introduction, inside a cavity of a mold, of the substrate 2 whereon the MEMS device 6 is mounted.

In the mold cavity the injection under pressure and at high temperature is then provided of an electrically insulating material at the melted state, which will be the plastic body of the protective package 11. This material is typically a synthetic resin, for example, epoxy resin.

The proper molding step involves the injection of the resin in the cavity of the mold. This step is then followed by a cooling step for completing the protective package 11.

For avoiding damage by the resin of the sensitive portion 9 of the MEMS device 6 during the resin injection step, according to embodiments, between the upper surface 3 of the substrate 2 and the active surface 8, the barrier element 12 is provided which completely surrounds at least the sensitive portion 9 of the MEMS device 6.

Advantageously, the barrier element 12 is a ring which completely surrounds the sensitive portion 9 of the MEMS device 6, when the MEMS device 6 is mounted on the substrate 2, and contacts the upper surface 3 of the substrate 2 and the active surface 8.

Advantageously, the barrier element 12 is formed by welding paste, therefore, in this embodiment, the electric connection step and the gluing step of the MEMS device 6 to the substrate 2 are carried out at the same time, resulting in a particularly compact structure of simple realization, not needing critical alignments between different structures.

In this first embodiment the outer edge of this barrier element 12 is completely coated by the protective package 11.

Figure 2:
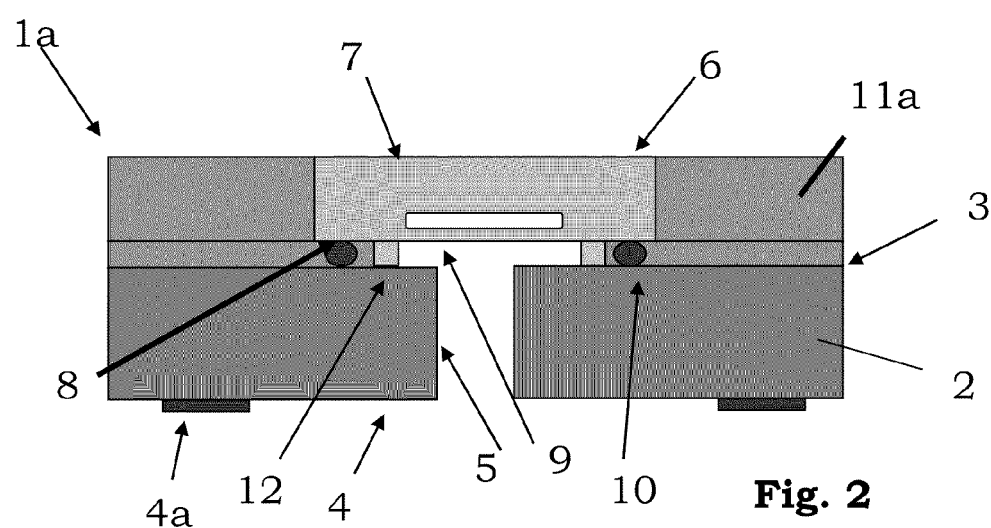
FIG. 2 is a sectional view of a further version of an electronic device including MEMS devices according to another embodiment.

Another embodiment of the device of FIG. 1 is shown with reference to FIG. 2.

Elements being structurally and functionally identical with respect to the device described with reference to FIG. 1 will be given the same reference numbers.

In particular, in this electronic device 1a, a protective package 11a, realized through molding, incorporates the MEMS device 6, the electric connections 10 and the substrate 2, leave the sensitive portion 9 and the non active surface 7 of the MEMS device 6, as well as the lower surface 4 and the opening 5 of the substrate 2 exposed.

Figure 3:
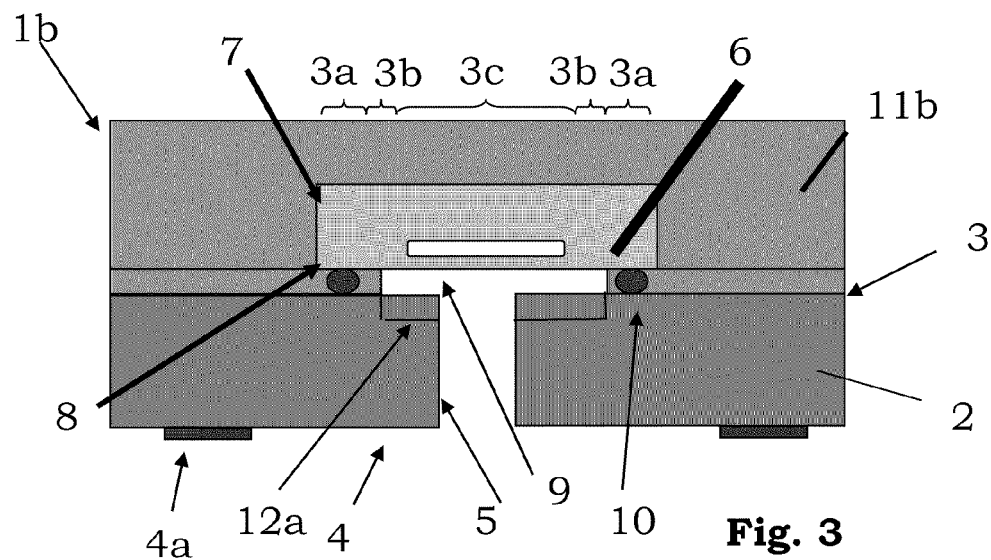
FIGS. 3 and 3a are sectional views of an electronic device including MEMS devices according to a second embodiment.
Figure 3A:
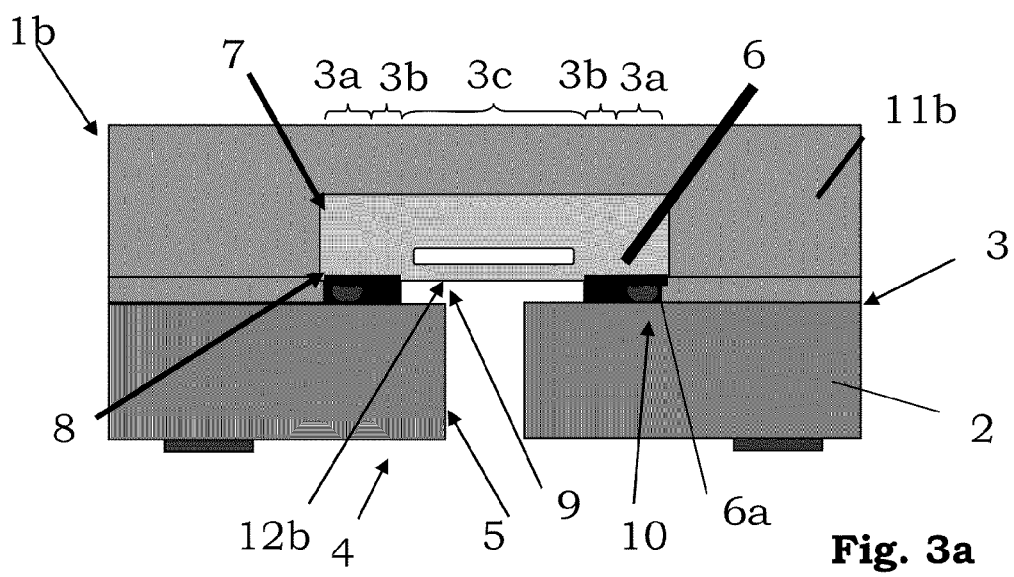
Figure 3B:
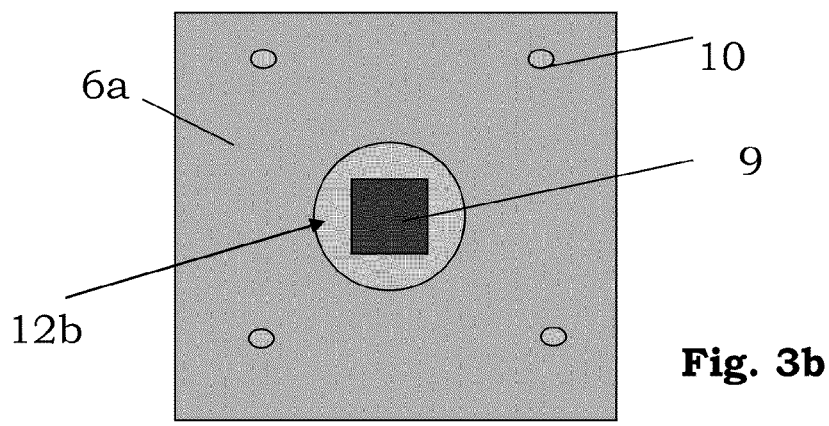

With reference to FIGS. 3, 3a and 3b, an electronic device 1b according to a second embodiment is shown.

Elements being structurally and functionally identical with respect to the device described with reference to FIG. 1 will be given the same reference numbers.

In particular, the electronic device 1b includes a substrate 2, for example of the LGA/BGA type, having an upper surface 3 and a lower surface 4 opposed to the upper surface 3, provided with an opening 5. A MEMS device 6 includes a die, for example of silicon, having a non active surface 7 and an active surface 8 opposed to the non active surface 7, wherein a sensitive portion 9 of a MEMS sensor is integrated.

According to this embodiment the active surface 8 of the MEMS device 6 faces the upper surface 3 of the substrate 2 and is spaced therefrom and the sensitive portion 9 is aligned to the opening 5.

Moreover, the peripheral portion of the active surface 8 of the MEMS device 6 is provided with connection lands for the electric connection to conductive tracks present on the upper surface 3 of the substrate 2, by means of electric connections 10, for example bumps.

Advantageously, the MEMS device 6 is electrically mounted on the substrate 2 by means of the known "flip-chip" assembly methods.

Therefore, between the active surface 8 of the MEMS device 6 and the upper surface 3 of the substrate 2 three areas are identified: a free central area 3c aligned to the sensitive portion 9, a lateral area 3a which surrounds the free central area 3c wherein electric connections 10 are present which electrically couple the MEMS device 6 with the substrate 2, and a mean area 3b included between the lateral area 3a and the free central area 3c.

Also according to this embodiment, the electronic device/ includes a protective package 11b, realized through molding, which incorporates the MEMS device 6, the electric connections 10 and the substrate 2, leaving the sensitive portion 9 of the MEMS device 6 and the lower surface 4 and the opening 5 of the substrate 2 exposed.

In other words, the MEMS device 6 is enclosed in the protective package 11b.

According to this embodiment, a barrier element 12a, 12b is positioned at least in an area 3b which surrounds the sensitive portion 9, i.e., it is realized at least in correspondence with the mean area 3b.

In this second embodiment, the barrier element 12a is an irregular area 12a formed on the upper surface 3 of the substrate 2 or the barrier element 12b is an irregular area 12b formed on the active surface 8 of the MEMS device 6.

Advantageously, this irregular area 12a, 12b shows a wrinkled surface.

Advantageously, this irregular area 12a extends on the upper surface 3 of the substrate 2 in correspondence with all the circuit free area 3c.

Advantageously, according to this embodiment this irregular area 12a is obtained by modifying the chemical properties of the upper surface 3 of the substrate 2, as shown in FIG. 3.

Advantageously, the irregular area 12a is formed by non wettable material.

This layer 12a of wettable material may be formed on the upper surface 3 of the substrate 2.

As shown in FIGS. 3a and 3b, advantageously according to this embodiment the barrier element 12b is formed by an irregular area 12b which is obtained by modifying the chemical properties of the active surface 8 of the MEMS device 6.

Advantageously, this irregular area 12b extends on the active surface 8 of the MEMS device 6 in correspondence with the whole sensitive portion 9 of the MEMS device 6.

It is in fact known that the active surface 8 of the MEMS device 6 is covered by a protection layer 6a including wettable material, for example a plastic layer, for example including organic material such as Polyimide.

According to this embodiment, from the sensitive portion 9 of the MEMS device 6 the layer element of wettable material 6a is removed leaving a dielectric layer 12b of the non wettable type exposed, for example silicon oxide, which covers the sensitive portion 9 of the MEMS device 6.

Advantageously, after the removal step from the sensitive portion 9 of the MEMS device 6 of the layer 6a of wettable material, the MEMS device 6 is welded on the substrate 2 and is subjected to a cleaning operation, for example in Plasma, by using a gas argon and oxygen mixture.

Advantageously, the oxygen of the cleaning mixture chemically reacts with the layer 6a of wettable material increasing its wettability, while the dielectric layer 12b which covers the sensitive portion 9 is inert to the treatment.

Therefore, as a result after the treatment an increased wettability of the layer 6a of wettable material is obtained, comparable to that of the upper surface 3 of the substrate 2 and a reduced wettability of the surface of the dielectric layer 12b which covers the sensitive portion 9.

This difference of wettability implies a sudden slow down of the resin flow during the molding step of the protective package 11b thereby the surface tension of the resin leads to the formation of a meniscus around the peripheral surface of the dielectric layer 12b which covers the sensitive portion 9.

Advantageously, as shown in FIG. 3b, the peripheral surface of the dielectric layer 12b is of circular shape.

The barrier layer 12b of non wettable material may be formed only on the active surface 8 of the upper MEMS device 3 of the substrate 2 of the sensitive portion 9.

In a further version of this second embodiment the irregular area 12a, 12b shows some wrinkles.

Advantageously, in the irregular area 12a, 12b trenches are formed in the substrate or in the MEMS device 6, so as to realize a preferred path defined in the substrate or on the MEMS device 6 for the resin during the molding step.

Advantageously, these trenches completely surround the sensitive portion 9 of the MEMS device 6.

Advantageously, in this latter embodiment a layer of non wettable material can be present in correspondence with the sensitive portion 9 of the MEMS device 6 in the area surrounded by the trenches.

According to this embodiment, the presence of this irregular area 12a, 12b protects the sensitive portion 9 during the manufacturing step of the protective package 11a, through molding, having the liquid resin uniformly distributed around the electric connections without reaching the sensitive portion 9.

Figure 4:
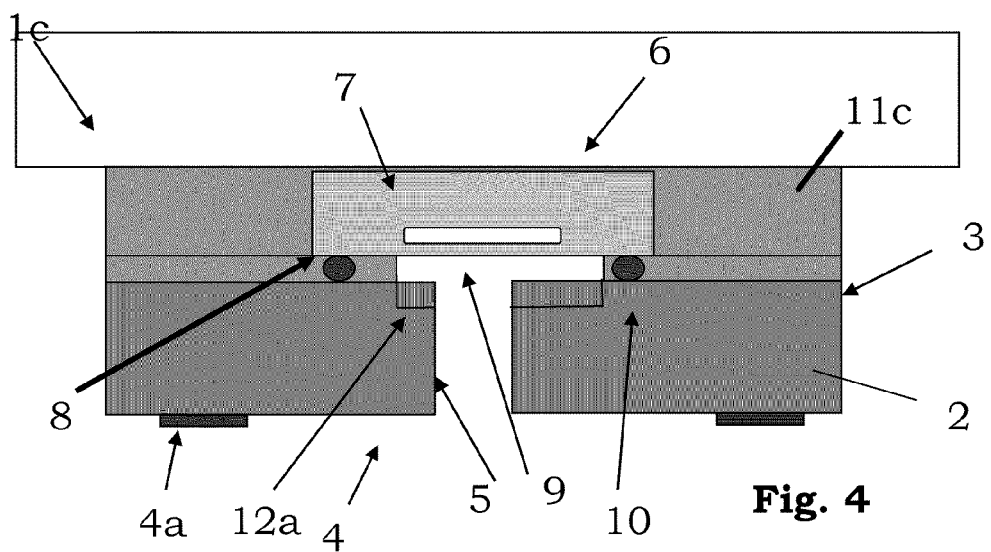
FIG. 4 is a sectional view of a further version of an electronic device including MEMS devices according to another embodiment.

An embodiment of the device of FIG. 3 is shown with reference to FIG. 4.

Elements being structurally and functionally identical with respect to the device described with reference to FIG. 3 will be given the same reference numbers.

In particular, in this electronic device 1c, a protective package 11c, realized through molding, incorporates the MEMS device 6, the electric connections 10 and the substrate 2, leaving the sensitive portion 9 and the non active surface 7 of the MEMS device 6, as well as the lower surface 4 and the opening 5 of the substrate 2 exposed.

Figure 5:
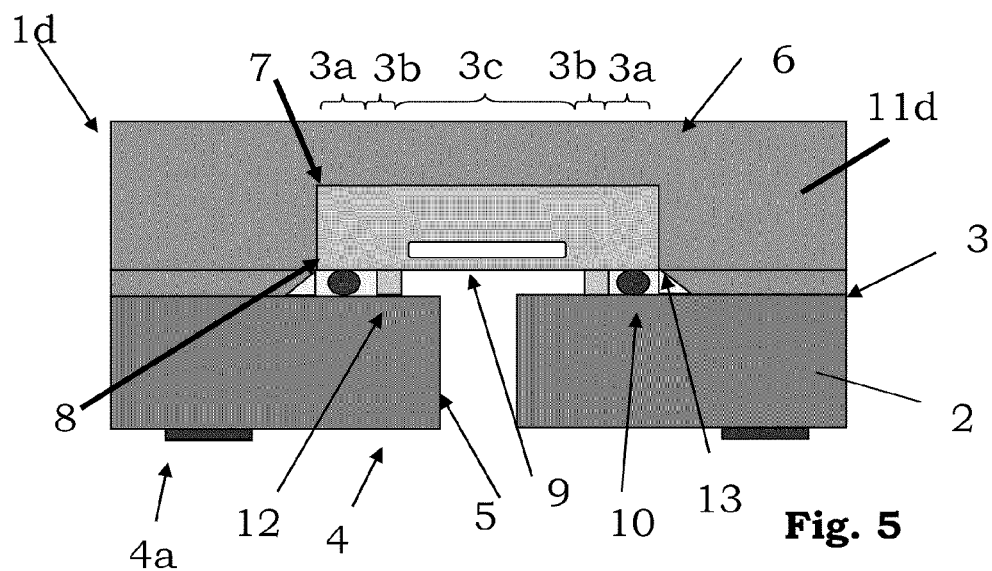
FIG. 5 is a sectional view of an electronic device including MEMS devices according to a third embodiment.

With reference to FIG. 5, an electronic device 1d according to a third embodiment is shown.

Elements being structurally and functionally identical with respect to the device described with reference to FIG. 1 will be given the same reference numbers.

In particular, in this embodiment an underfiller 13 is present in the lateral area 3a so as to incorporate the electric connections 10 for mechanically strengthening the electronic device 1 in the connection area between the MEMS device 6 and the substrate 2.

Advantageously, the underfiller 13 is epoxy resin.

Advantageously, the underfiller 13 shows a profile tapered outwards with respect of the lateral area 3a on the opposite side with respect to the mean area 3b, while it shows a substantially vertical profile in correspondence with the mean area 3b.

In other words, the cross section of the underfiller 13 increases when approaching the upper surface 3 of the substrate 2.

The electronic device 1d also includes a protective package 11d, realized through molding, which incorporates the MEMS device 6, the underfiller 13 and the substrate 2, leaving the sensitive portion 9 of the MEMS device 6 and the lower surface 4 and the opening 5 of the substrate 2 exposed.

The presence of the barrier material 12 allows maintaining the sensitive portion 9 of the MEMS device 6, i.e., the central free area 3c, free from the underfiller 13.

Moreover, the underfiller 13 protects the active surface 8 of the MEMS device 6 during the manufacturing step of the plastic package 11d.

Figure 6:
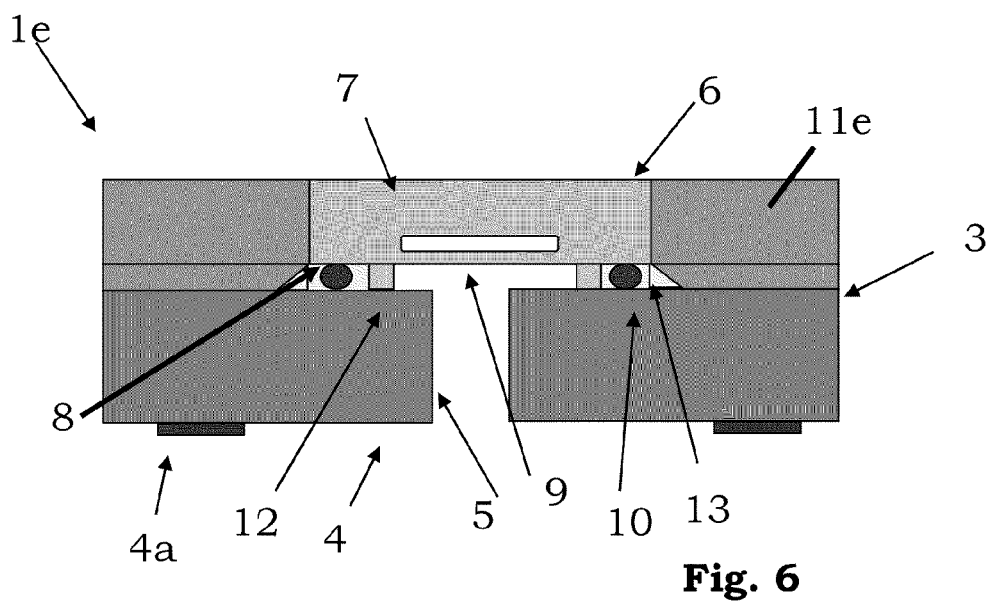
FIG. 6 is a sectional view of a further version of an electronic device including MEMS devices according to a third embodiment.

An embodiment of the device of FIG. 5 is shown with reference to FIG. 6.

Elements being structurally and functionally identical with respect to the device described with reference to FIG. 5 will be given the same reference numbers.

In particular, in this electronic device 1e, a protective package 11e, realized through molding, incorporates the MEMS device 6, the underfiller 13 and the substrate 2, leaving the sensitive portion 9 and the non active surface 7 of the MEMS device 6, as well as the lower surface 4 and the opening 5 of the substrate 2 exposed.

Figure 7A:
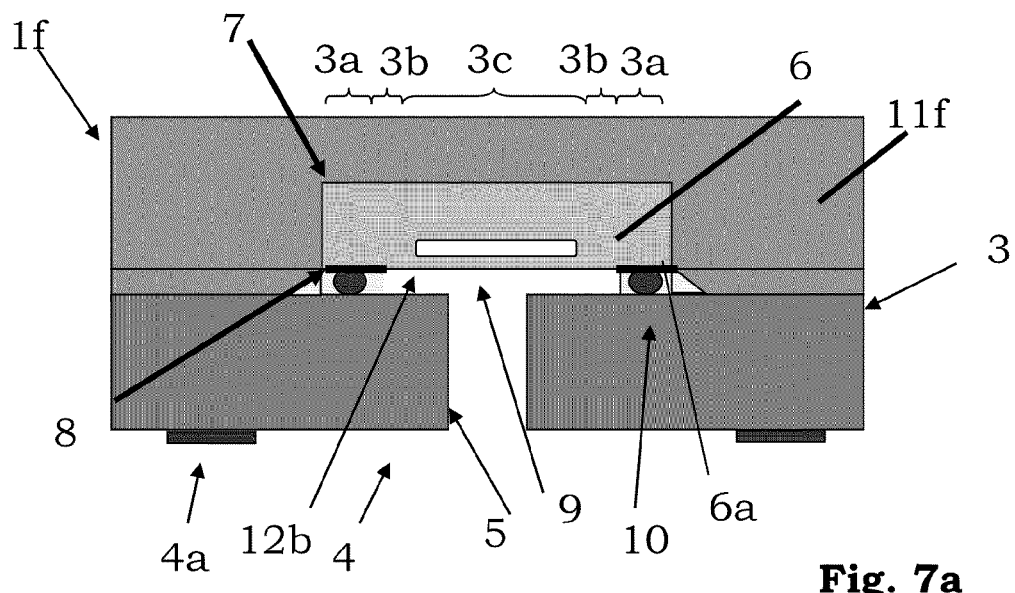
FIG. 7a is a sectional view of a further version of an electronic device including MEMS devices according to another embodiment.
Figure 7:
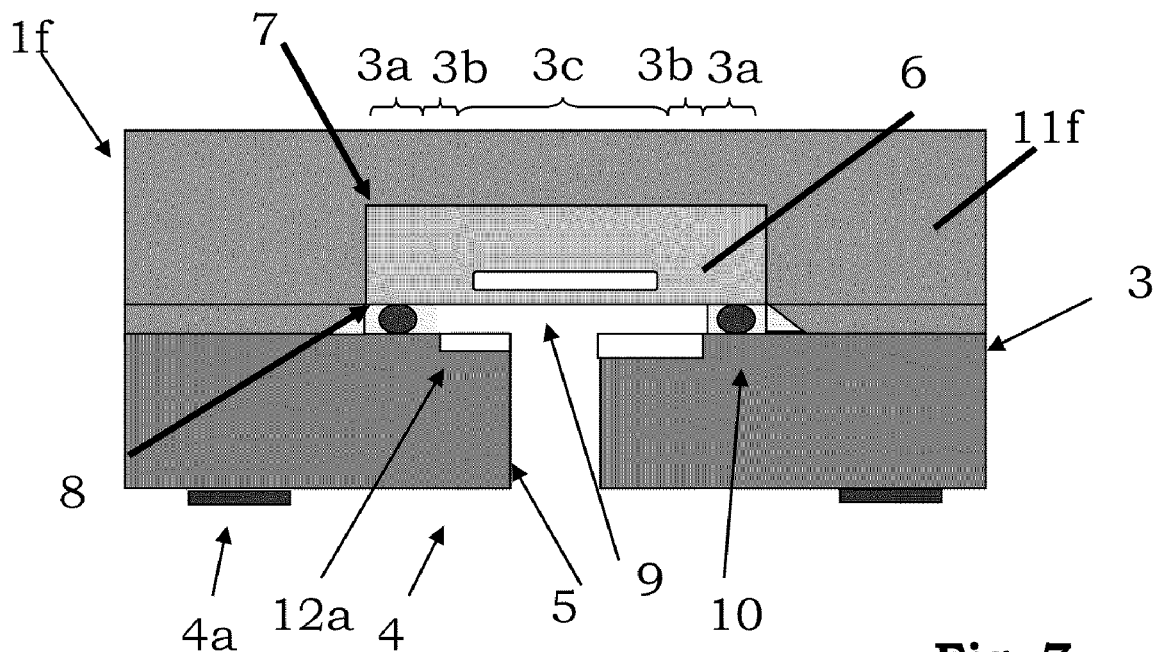
FIG. 7 is a sectional view of an electronic device including MEMS devices according to a fourth embodiment.

With reference to FIG. 7, an electronic device if according to a fourth embodiment is shown.

Elements being structurally and functionally identical with respect to the device described with reference to FIG. 3 will be given the same reference numbers.

In particular, in this embodiment an underfiller 13 is present in the lateral area 3a so as to incorporate the electric connections 10 to mechanically strengthen the electronic device 1 in the connection area between the MEMS device 6 and the substrate 2.

Advantageously, the underfiller 13 shows a tapered profile outside the lateral area 3a on the opposite side with respect to the mean area 3b, while it shows a substantially vertical profile in correspondence with the mean area 3b.

In other words, the cross section of the underfiller 13 increases when approaching the upper surface 3 of the substrate 2.

The electronic device if also includes a protective package 11f, realized through molding, which incorporates the MEMS device 6, the underfiller 13 and the substrate 2, leaving the sensitive portion 9 of the MEMS device 6 and the lower surface 4 and the opening 5 of the substrate 2 exposed.

The presence of the barrier element 12a allows maintaining the sensitive portion 9 of the MEMS device 6 free from the underfiller 13.

A further embodiment of the device of FIG. 7 is shown with reference to FIG. 7a.

Elements being structurally and functionally identical with respect to the device described with reference to FIG. 7 will be given the same reference numbers.

In this embodiment the barrier element 12b is formed on the active surface 8 of the MEMS device 6 around the sensitive portion 9, prior to the formation of the underfiller 13, with the same modes with which the barrier element 12b of FIG. 3a is realized.

In particular, the difference of wettability between the barrier element 12b and the portion outside the barrier layer implies a sudden slow down of the flow of the underfiller 13 during its dispensing step after the MEMS device 6 has been fixed to the substrate, thereby the surface tension of the underfiller 13 leads to the formation of a meniscus around the peripheral surface of the barrier element 12b which at least surrounds the sensitive portion 9.

Figure 8:
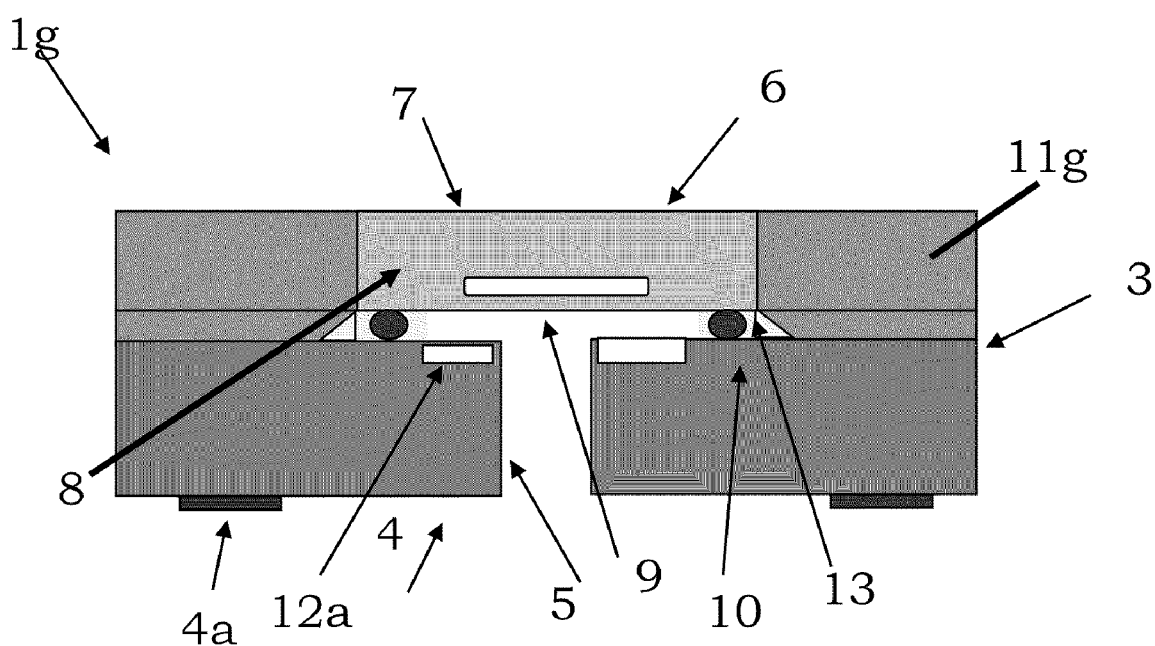
FIG. 8 is a sectional view of a further version of an electronic device including MEMS devices according to another embodiment.

An embodiment of the device of FIG. 7 is shown with reference to FIG. 8.

Elements being structurally and functionally identical with respect to the device described with reference to FIG. 7 will be given the same reference numbers.

In particular, in this electronic device 1g, a protective package 11g, realized through molding, incorporates the MEMS device 6, the underfiller 13 and the substrate 2, leaving the sensitive portion 9 and the non active surface 7 of the MEMS device 6, as well as the lower surface 4 and the opening 5 of the substrate 2 exposed.

In particular, in this embodiment an underfiller 13 is present in the lateral area 3a so as to incorporate the electric connections 10 to mechanically strengthen the electronic device 1 in the connection area between the MEMS device 6 and the substrate 2.

Figure 9:
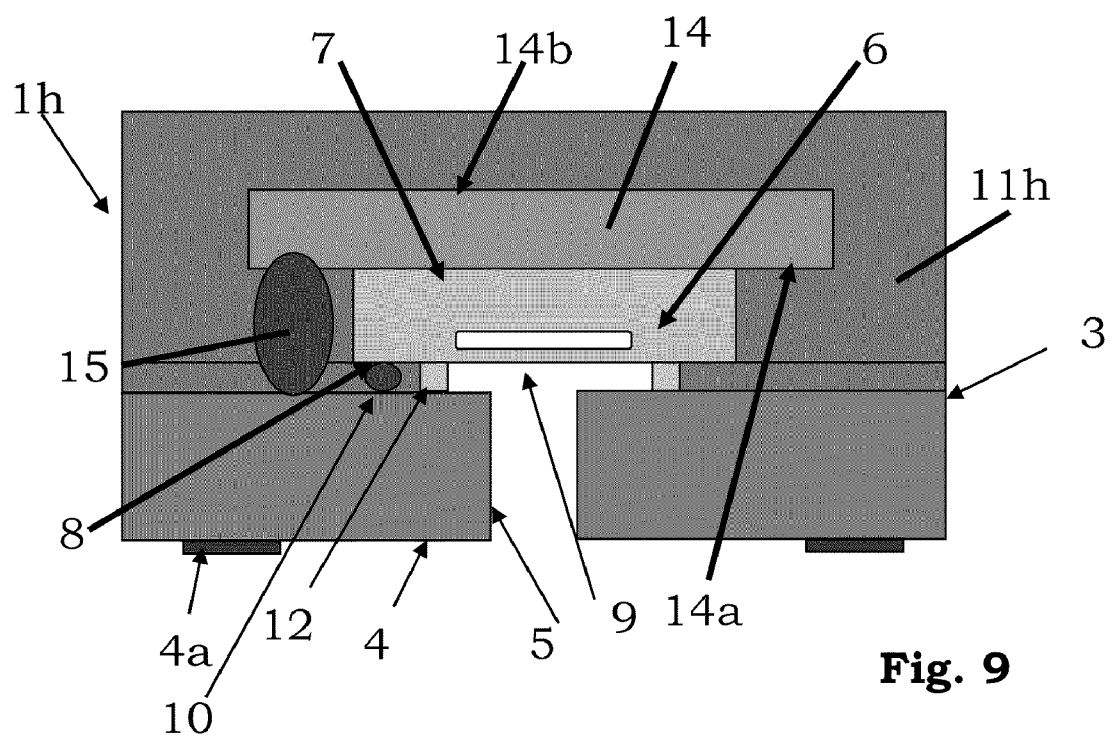
FIGS. 9 to 20 are sectional views of applications of the electronic devices including MEMS devices realized according to embodiments.
Figure 10:
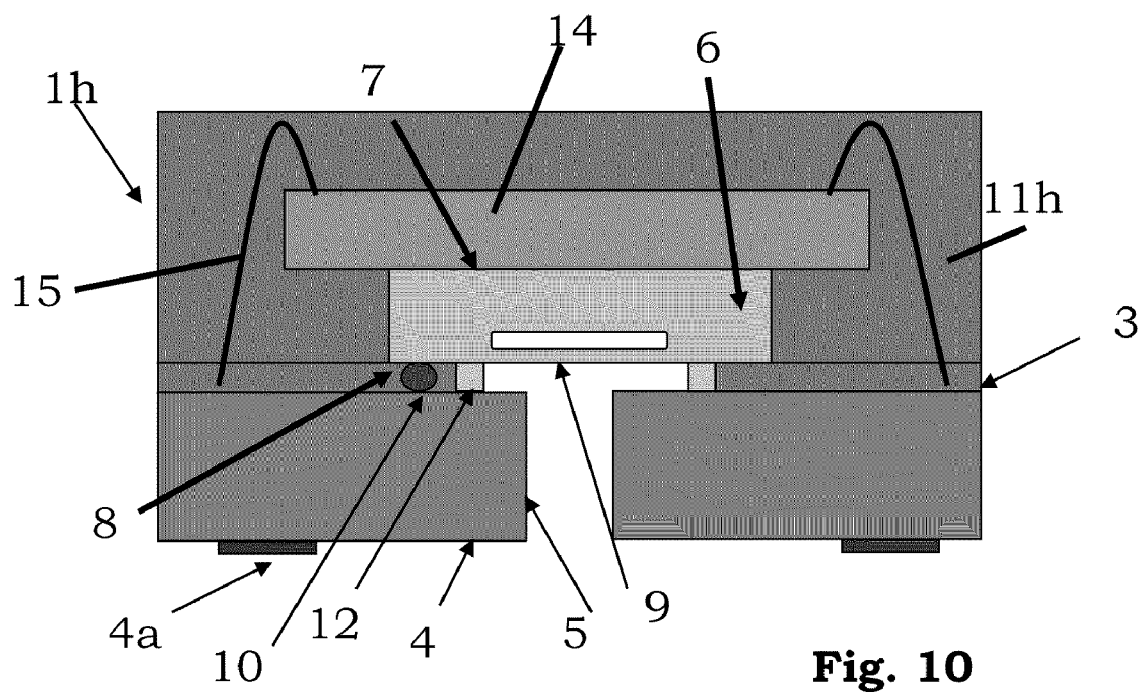

With reference to FIGS. 9 and 10, two further versions of an electronic device 1h according to the first embodiment are shown.

Elements being structurally and functionally identical with respect to the device described with reference to FIG. 1 will be given the same reference numbers.

In particular, the electronic device 1h includes an integrated circuit 14 having a first surface 14a and a second surface 14b opposed to the first surface, the integrated circuit 14 being mounted with the first surface 14a on the non active surface 7 of the MEMS device 6.

The integrated circuit 14 is thus electrically coupled to the conductive tracks present on the upper surface 3 of the substrate 2 by means of further electric connections 15.

For example, the dimension of the cross section of this integrated circuit 14 is greater than the dimension of the cross section of the MEMS device 6.

Advantageously, as shown in FIG. 9, on the first surface 14a a passivated circuitry is integrated and moreover the first surface 14a is provided with connection lands for the electric connection to the MEMS device 6, by means of bumps.

Advantageously, as shown in FIG. 10, on the second surface 14b a passivated circuitry is integrated and moreover connection lands are provided for the electric connection to the MEMS device 6 through wire-bonding.

A protective package 11h, realized through molding, incorporates the MEMS device 6, the integrated circuit 14, the connections 15 and the substrate 2, leaving the sensitive portion 9 and the non active surface 7 of the MEMS device 6, as well as the lower surface 4 and the opening 5 of the substrate 2 exposed.

Figure 11:
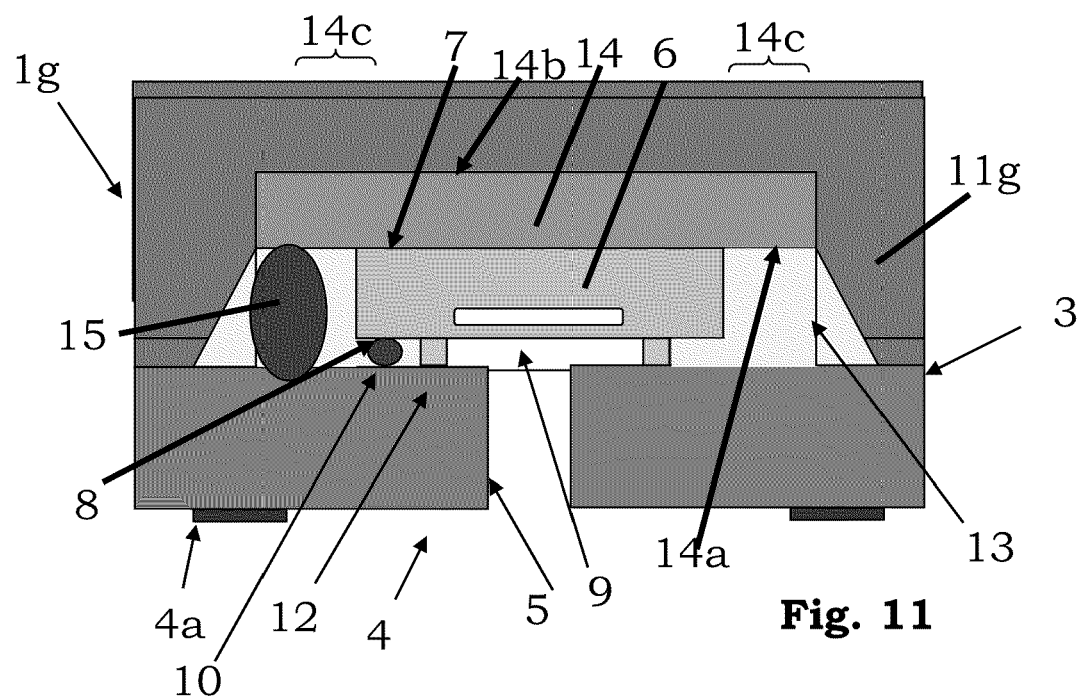
Figure 12:
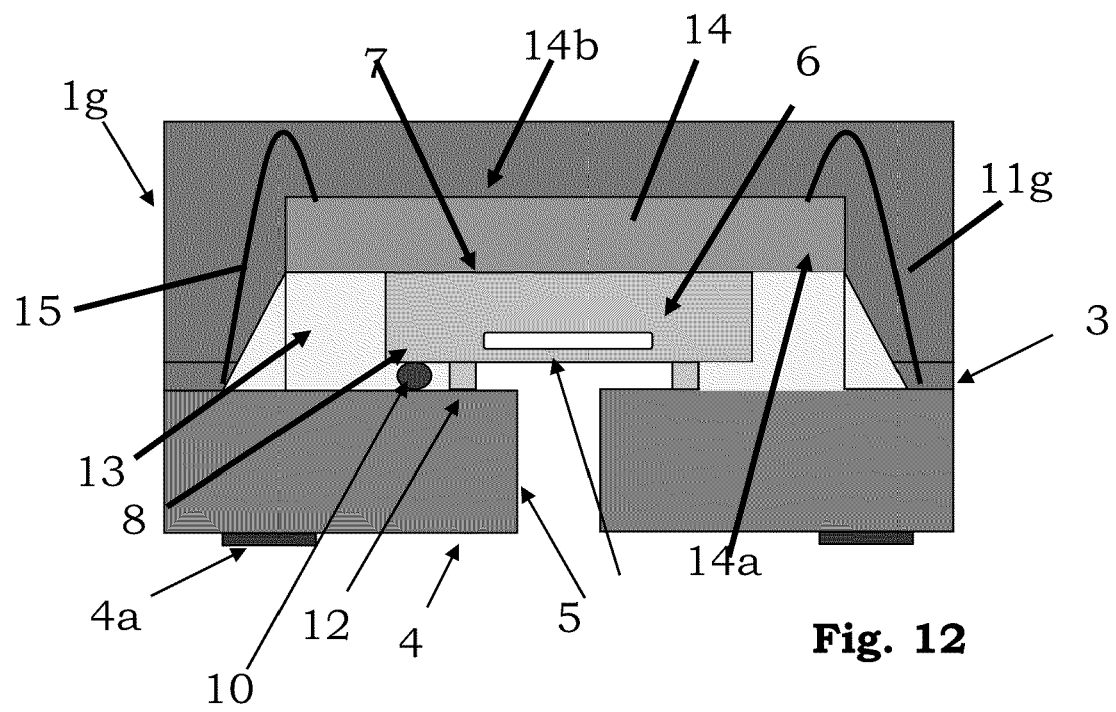

With reference to FIGS. 11 and 12, two further versions are shown of an electronic device 1g according to the third embodiment.

Elements being structurally and functionally identical with respect to the device described with reference to FIG. 5 will be given the same reference numbers.

In particular, the electronic device 1g includes an integrated circuit 14 having a first surface 14a and a second surface 14b opposed to the first surface, which is mounted with the first surface 14a on the non active surface 7 of the MEMS device 6.

The integrated device 14 is then electrically coupled to the conductive tracks formed on the upper surface 3 of the substrate 2 by means of further electric connections 15.

Advantageously, the dimension of the cross section of this integrated circuit 14 is greater than the dimension of the cross section of the MEMS device 6.

Advantageously, the underfiller 13 is also present in an area 14c included between a portion of the first surface 14a projecting with respect to the MEMS device and the upper surface 3 of the substrate 2.

Advantageously, the underfiller 13 shows a tapered profile outside the area 14c.

In other words the cross section of the underfiller 13 increases when approaching the upper surface 3 of the substrate 2.

Advantageously, as shown in FIG. 11, the first surface 14a is provided with connection lands for the electric connection to the MEMS device 6, by means of bump (flip-chip) bonding.

Advantageously, as shown in FIG. 12, the second surface 14b is provided with connection lands for the electric connection to the MEMS device 6, by means of connection wires (wirebonding).

A protective package 11g, realized through molding, incorporates the MEMS device 6, the integrated circuit 14, the connections 15, the underfiller 13 and the substrate 2, leaving the sensitive portion 9 and the non active surface 7 of the MEMS device 6, as well as the lower surface 4 and the opening 5 of the substrate 2 exposed.

The presence of the underfiller 13 allows the protection of both the integrated circuit 14 and the MEMS device 6 during the molding step of the protective package 11g.

Figure 13:
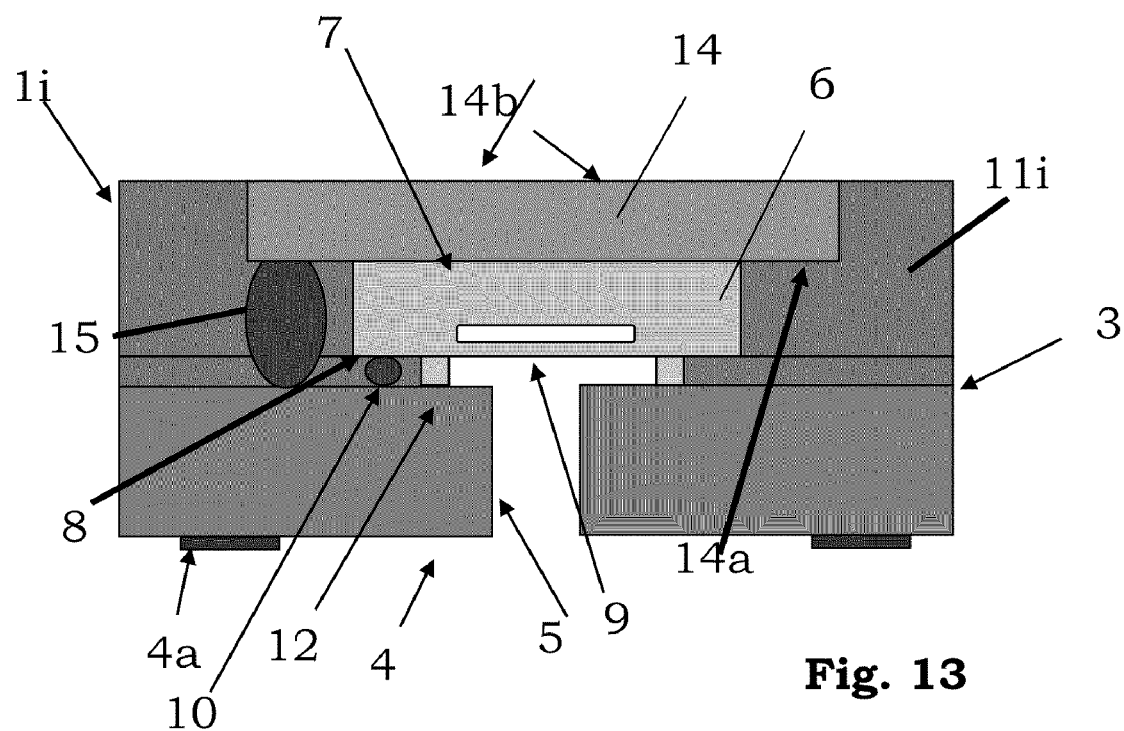

With reference to FIG. 13 the electronic device 1i is shown which is a further version of the electronic device of FIG. 9, wherein the protective package 11i leaves the second surface 14b of the integrated circuit 14 exposed.

Figure 14:
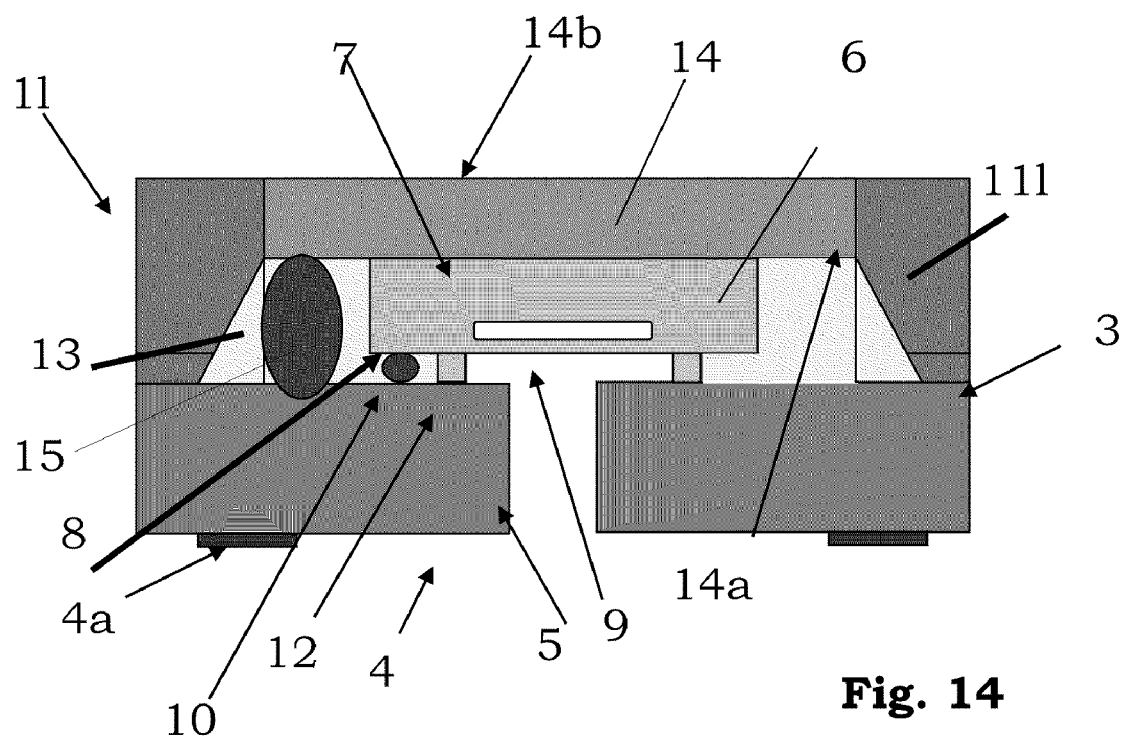

With reference to FIG. 14 the electronic device 1l is shown which is a further embodiment of the electronic device of FIG. 11, wherein the protective package 11l leaves the second surface 14b of the integrated circuit 14 exposed.

Figure 15:
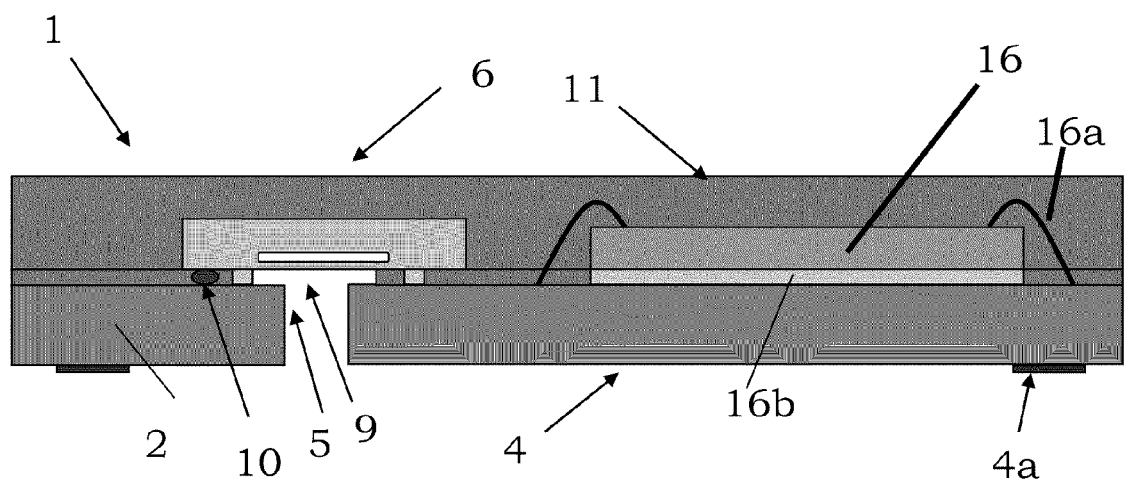

With reference to FIG. 15, the device 1 of FIG. 1 is shown wherein an integrated circuit 16 is mounted on the substrate 2 flanked by the MEMS device 6, and fixed to the substrate 2, for example by means of a welding layer 16b.

The integrated circuit 16 is electrically coupled to the substrate 2 by means of further electric connections 16a.

The protective package 11, realized through molding, incorporates the MEMS device 6 with the electric connections 10, the integrated circuit 16 with the electric connections 16a and the substrate 2, leaving the sensitive portion 9 of the MEMS device 6, as well as the lower surface 4 and the opening 5 of the substrate 2 exposed.

Figure 16:
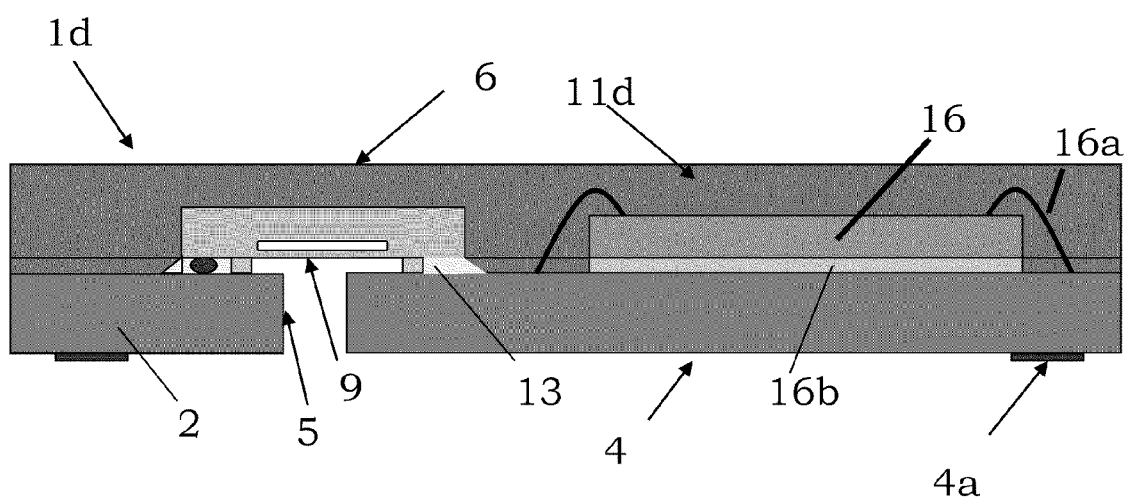

With reference to FIG. 16, the device 1d of FIG. 5 is shown wherein an integrated circuit 16 is mounted on the substrate 2 flanked to the MEMS device 6, and fixed to the substrate 2, for example by means of a welding layer 16b.

The integrated circuit 16 is electrically coupled to the substrate 2 by means of further electric connections 16a.

The protective package 11d, realized through molding, incorporates the MEMS device 6, the underfiller 13, the integrated circuit 16 with the further electric connections 16a and the substrate 2, leaving sensitive portion 9 of the MEMS device 6, as well as the lower surface 4 and the opening 5 of the substrate 2 exposed.

Figure 17:
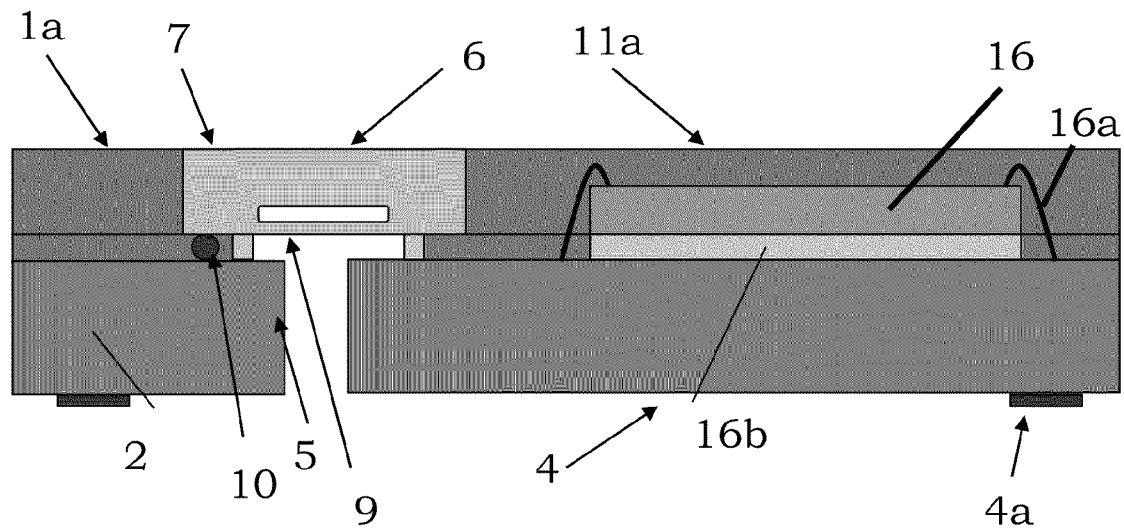

With reference to FIG. 17, the device 1a of FIG. 2 is shown wherein an integrated circuit 16 is mounted on the substrate 2 flanked to the device MEMS 6, and fixed to the substrate 2, for example by means of a welding layer 16b.

The integrated circuit 16 is electrically coupled to the substrate 2 by means of further electric connections 16a.

The protective package 11a, realized through molding, incorporates the MEMS device 6 with the electric connections 10, the integrated circuit 16 with the further electric connections 16a and the substrate 2, leaving the sensitive portion 9 and the non active surface 7 of the MEMS device 6, as well as the lower surface 4 and the opening 5 of the substrate 2 exposed.

Figure 18:
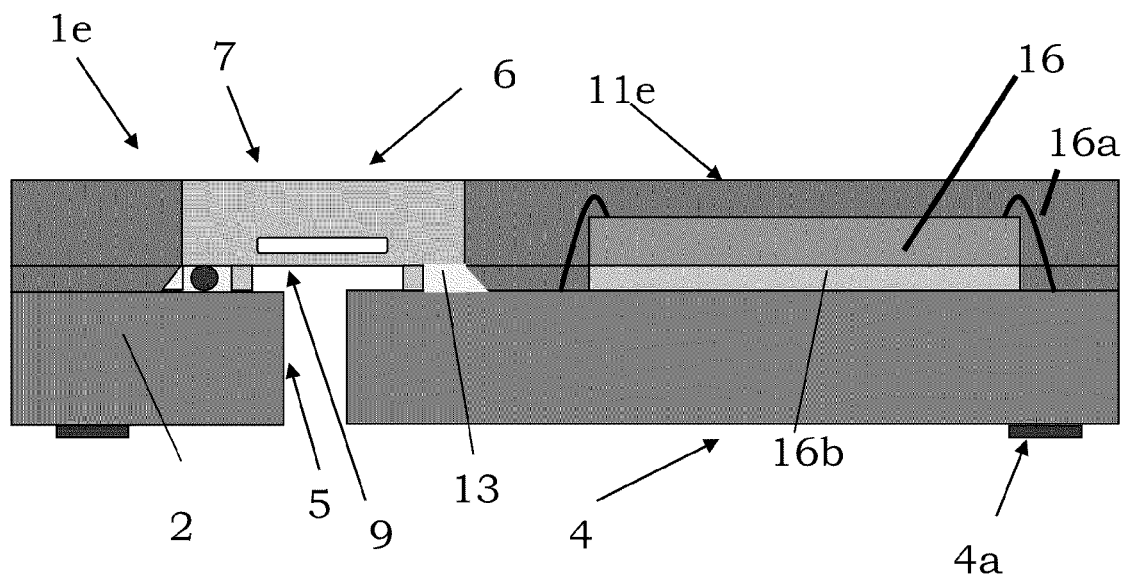

With reference to FIG. 18, the device 1e of FIG. 6 is shown wherein an integrated circuit 16 is mounted on the substrate 2 flanked to the MEMS device 6, and fixed to the substrate 2, for example by means of a welding layer 16b.

The integrated circuit 16 is electrically coupled to the substrate 2 by means of further electric connections 16a.

The protective package 11e, realized through molding, incorporates the MEMS device 6, the underfiller 13, the integrated circuit 16 with the further electric connections 16a and the substrate 2, leaving the sensitive portion 9 and the non active surface 7 of the MEMS device 6, as well as the lower surface 4 and the opening 5 of the substrate 2 exposed.

Figure 19:
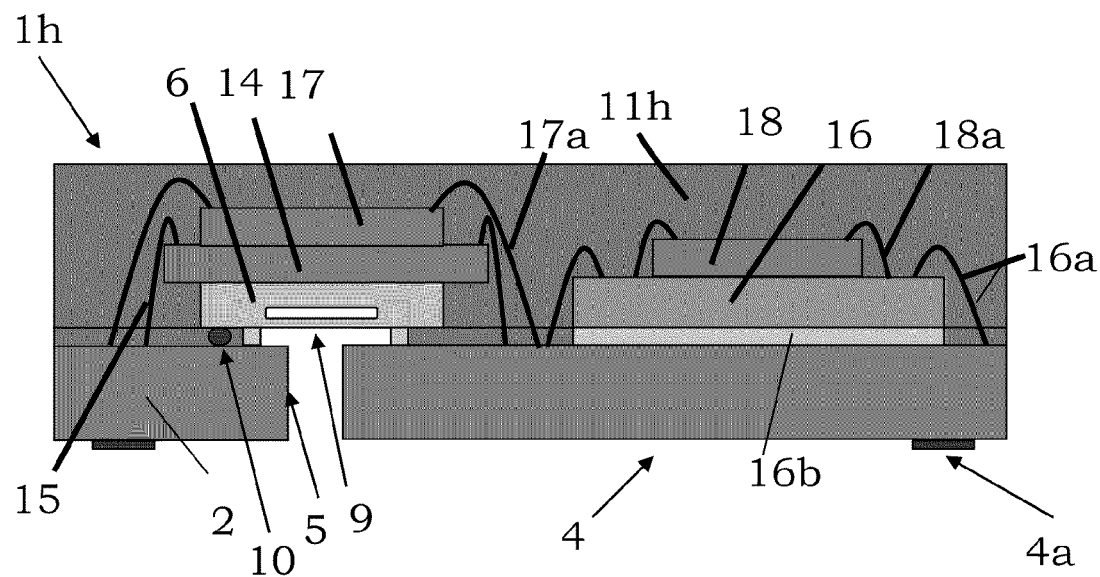

With reference to FIG. 19, the device 1h of FIG. 9 is shown wherein a second integrated circuit 16 is mounted on the substrate 2 flanked to the MEMS device 6, and fixed to the substrate 2, for example by means of a welding layer 16b.

The second integrated circuit 16 is electrically coupled to the substrate 2 by means of further electric connections 16a.

A third integrated circuit 17 is mounted on the second surface 14b of the integrated circuit 14, and electrically coupled to the substrate 2 by means of further electric connections 17a.

A fourth integrated circuit 18 is mounted on the second integrated circuit 16 and electrically coupled to the substrate 2 by means of further electric connections 18a.

The protective package 11h, realized through molding, incorporates the MEMS device 6, the electric connections 10, the integrated circuits 14, 16, 17 and 18 with the relative electric connections 15, 16a, 17a and 18a and the substrate 2, leaving the sensitive portion 9 of the MEMS device 6, as well as the lower surface 4 and the opening 5 of the substrate 2 exposed.

Figure 20:
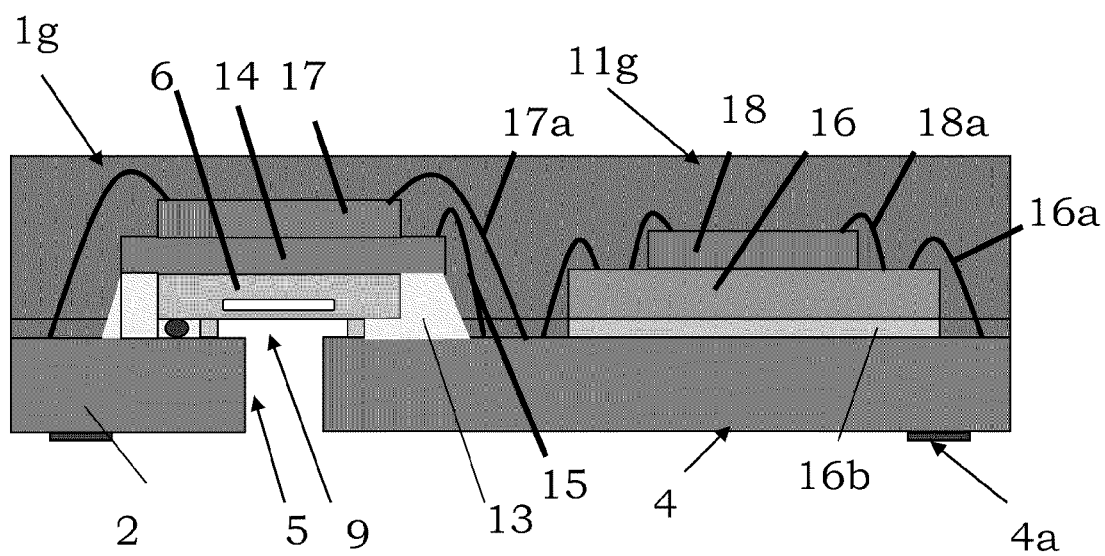

With reference to FIG. 20, the device 1g of FIG. 11 is shown wherein a second integrated circuit 16 is mounted on the substrate 2 flanked to the MEMS device 6, and fixed to the substrate 2, for example by means of a welding layer 16b.

The second integrated circuit 16 is electrically coupled to the substrate 2 by means of further electric connections 16a.

A third integrated circuit 17 is mounted on the second surface 14b of the integrated circuit 14, and electrically coupled to the substrate 2 by means of further electric connections 17a.

A fourth integrated circuit 18 is mounted on the second integrated circuit 16 and electrically coupled to the substrate 2 by means of further electric connections 18a.

The protective package 11g, realized through molding, incorporates the MEMS device 6, the underfiller 13, the integrated circuits 14, 16, 17 and 18 with the relative electric connections 15, 16a, 17a and 18a and the substrate 2, leaving the sensitive portion 9 of the MEMS device 6, as well as the lower surface 4 and the opening 5 of the substrate 2 exposed.

Advantageously, the integrated circuits 14, 16, 17 and 18 can be sensor devices, for example accelerometers 14, gyroscopes 18, magnetometers 17 to form an IMU (inertial measurement unit).

These integrated circuits can be put in different configurations inside the protective package on the basis of their dimensions and geometric features.

With devices according to embodiments it is possible to realize microphones, pressure, gas, chemical sensors, which are encapsulated in a protective package realized by means of molding. These devices can, in turn, be contained in a variety of different types of electronic systems, such as barometric systems, audio systems, computer systems, control systems, safety systems, and so on.

It is then possible to integrate more sensors (accelerometers and pressure sensors) in the same protective package 11, for example to realize the IMU, or for barometric stations by integrating, for example, a pressure sensor and a humidity sensor.

Advantageously, in electronic devices according to one embodiment and previously described, the electronic device as a whole shows an overall dimension included between 3×3×1 mm^3, while the MEMS device 6 has a width of 1500 µm a length of 1500 µm and a thickness of 700 µm.

The sensitive portion 9 of the MEMS device 6 has a diameter included between 100 µm and 1000 µm.

The distance between the active surface 8 of the MEMS device 6 and the upper surface 3 of the substrate is included between 50 and 500 µm, while the thickness of the substrate is included between about 150 and 300 µm and the width of the opening 5 is included between 100 and 700 µm.

If the barrier element 12 is realized with a ring of welding paste it has a thickness of a cross section included between 60 and 300 µm.

If the barrier element 12a, 12b is realized with an irregular area it has a width of a cross section of about 10-50 µm and, for example, a depth included between 20-80 µm.

In conclusion, electronic devices according to embodiments are particularly compact and use technical solutions which do not provide critical alignments. Advantageously according to embodiments, the presence of the barrier element 12, 12a allows protecting the sensitive portion 9 of the MEMS device 6 during the manufacturing steps of the protective package 11 or during the dispensing step of the underfiller 13 in the electronic device 1.

In particular, according to embodiments, this barrier element 12, 12a, 12b can be of physical or chemical nature or a combination of the two.

These barrier elements 12, 12a, 12b can be realized both on the substrate 2 and on the MEMS device 6.

From the foregoing it will be appreciated that, although specific embodiments have been described herein for purposes of illustration, various modifications may be made without deviating from the spirit and scope of the present disclosure.

The invention claimed is:

1. A method of protecting packages including a substrate and a die, the die including an active surface including a sensitive portion and the method comprising:
   forming a passing opening in the substrate;
   attaching the die to the substrate;
   forming a protective package to house the substrate and the die, the protective package leaving the passing opening exposed; and
   forming a barrier layer that isolates the sensitive portion of the die from the protective package.

2. The method of claim 1 wherein the barrier layer is formed on the active surface of the substrate.

3. The method of claim 1 wherein the barrier layer is formed on a surface of the substrate surrounding and adjacent to the passing opening.

4. The method of claim 1 wherein forming the barrier layer further comprises forming an irregular area on the surface of the substrate.

5. The method of claim 1, further comprising electrically coupling the die to an integrated circuit such that the protective package also houses the integrated circuit.

6. The method of claim 1, further comprising attaching the die to the substrate set apart from the opening.

7. A method for manufacturing an electronic device, comprising:
   forming a substrate having an opening,
   disposing a MEMS device comprising an active surface that is sensitive to chemical/physical variations of a fluid, the active portion facing the substrate and spaced apart from the substrate and aligned to the opening; and
   forming a non-semiconductor protective package over the MEMS device and the substrate such that the active portion of the MEMS device and the opening of the substrate are exposed.

8. The method of claim 7, further comprising forming a barrier element positioned in an area which surrounds the active portion, the barrier realizing a protection structure for the MEMS device.

9. The method of claim 8 wherein forming the barrier element further comprises forming a ring that is in contact with the surface of the substrate and with the active surface of the MEMS device, and wherein the barrier element comprises an external edge completely covered by the protective package.

10. The method of claim 8 wherein forming the barrier element further comprises forming an irregular area on the surface of the substrate.

11. The method of claim 10 wherein forming the irregular area further comprises forming the irregular area such that the irregular area is congruent with the active portion and disposed on the substrate.

12. The method of claim 10 wherein forming the irregular area further comprises modifying chemical properties of the surface of the substrate.

13. The method of claim 10 wherein forming the irregular area further comprises forming the irregular area with a non-wettable material.

14. The method of claim 8, further comprising forming electric connections electrically coupled to the MEMS device outside the barrier element with respect to the active portion.

15. The method of claim 14, further comprising forming an underfiller incorporating the electric connections.

16. The method of claim 7, further comprising mounting at least one integrated circuit adjacent to the MEMS device.

17. The method of claim 7, wherein forming the protective package further comprises incorporating the at least one integrated circuit.

18. The method of claim 7, further comprising forming the active area of the MEMS device to sensitive to pressure.

19. The method of claim 7, further comprising forming the active area of the MEMS device to sensitive to a gas.

20. The method of claim 7, further comprising forming the active area of the MEMS device to sensitive to a chemical.

21. The method of claim 7, further comprising forming the protective package through molding.

* * * * *